(12) United States Patent
Dobkin et al.

(10) Patent No.: US 8,661,383 B1
(45) Date of Patent: Feb. 25, 2014

(54) VLSI BLACK-BOX VERIFICATION

(75) Inventors: Rostislav (Reuven) Dobkin, Yokneam Illit (IL); Leonid Brook, Haifa (IL)

(73) Assignee: VSYNC Circuits, Ltd., Yokneam Illit (IL)

( * ) Notice: Subject to any disclaimer, the term of this patent is extended or adjusted under 35 U.S.C. 154(b) by 0 days.

(21) Appl. No.: 13/557,215

(22) Filed: Jul. 25, 2012

Related U.S. Application Data

(63) Continuation-in-part of application No. 13/191,487, filed on Jul. 27, 2011.

(60) Provisional application No. 61/511,581, filed on Jul. 26, 2011, provisional application No. 61/368,276, filed on Jul. 28, 2010.

(51) Int. Cl.
*G06F 17/50* (2006.01)

(52) U.S. Cl.
USPC .......... 716/106; 716/102; 716/103; 716/104; 716/105; 716/108

(58) Field of Classification Search
USPC .................. 716/102, 103, 104, 105, 106, 108
See application file for complete search history.

(56) References Cited

U.S. PATENT DOCUMENTS

| | | | |
|---|---|---|---|
| 5,870,308 A | 2/1999 | Dangelo et al. | |
| 6,169,968 B1 | 1/2001 | Kabuo | |
| 6,836,877 B1 * | 12/2004 | Dupenloup | 716/103 |
| 7,082,584 B2 * | 7/2006 | Lahner et al. | 716/102 |
| 7,248,661 B1 | 7/2007 | Almog et al. | |
| 7,328,421 B1 * | 2/2008 | Ballagh et al. | 716/103 |
| 7,779,286 B1 * | 8/2010 | Pritchard et al. | 713/400 |
| 7,779,322 B1 * | 8/2010 | Wang et al. | 714/729 |
| 7,870,528 B2 * | 1/2011 | Ja et al. | 716/126 |
| 7,908,574 B2 * | 3/2011 | Larouche et al. | 716/100 |
| 7,962,886 B1 | 6/2011 | Pandey et al. | |
| 7,984,400 B2 * | 7/2011 | Maixner et al. | 716/106 |
| 7,984,404 B2 | 7/2011 | Do et al. | |
| 8,037,437 B2 * | 10/2011 | Davis et al. | 716/113 |
| 8,117,577 B1 * | 2/2012 | Vadi et al. | 716/108 |
| 8,271,918 B2 * | 9/2012 | Kwok et al. | 716/108 |
| 8,418,092 B2 * | 4/2013 | Basto et al. | 716/101 |
| 8,448,111 B2 * | 5/2013 | Mneimneh et al. | 716/108 |
| 2003/0192023 A1 | 10/2003 | Murphy | |
| 2004/0221249 A1 | 11/2004 | Lahner et al. | |
| 2004/0225974 A1 | 11/2004 | Johnson | |
| 2005/0097484 A1 | 5/2005 | Sarwary et al. | |
| 2005/0268258 A1 * | 12/2005 | Decker | 716/4 |

(Continued)

OTHER PUBLICATIONS

Chiorboli et al.; ADC modeling and testing; Publication Year: 2001; Instrumentation and Measurement Technology Conference, 2001. IMTC 2001. Proceedings of the 18th IEEE; vol. 3; pp. 1992-1999 vol. 3.*

(Continued)

*Primary Examiner* — Helen Rossoshek
(74) *Attorney, Agent, or Firm* — D. Kligler IP Services Ltd.

(57) ABSTRACT

A circuit verifier scans through a description of an integrated circuit to identify black-boxes in the description. The verifier assigns the identified black-boxes to clock domains and identifies clock domain crossings, in which a black-box assigned to a first clock domain is connected to an element belonging to a second clock domain. In some cases the verifier identifies signal reconvergence through black-boxes.

19 Claims, 4 Drawing Sheets

(56) References Cited

U.S. PATENT DOCUMENTS

| | | | |
|---|---|---|---|
| 2005/0273735 A1 | 12/2005 | Dargelas | |
| 2006/0190754 A1 | 8/2006 | Dargelas et al. | |
| 2006/0282808 A1 | 12/2006 | Byrn et al. | |
| 2007/0271538 A1 | 11/2007 | Douady et al. | |
| 2008/0008021 A1 | 1/2008 | Sarwary et al. | |
| 2008/0301601 A1* | 12/2008 | Ng et al. | 716/5 |
| 2008/0313578 A1 | 12/2008 | Maixner et al. | |
| 2008/0313579 A1* | 12/2008 | Larouche et al. | 716/3 |
| 2009/0235222 A1 | 9/2009 | Raje et al. | |
| 2010/0180240 A1 | 7/2010 | Davis et al. | |
| 2010/0306725 A1* | 12/2010 | Kawasaki | 716/10 |
| 2010/0315134 A1 | 12/2010 | Murari | |
| 2010/0322365 A1 | 12/2010 | Dobkin et al. | |

OTHER PUBLICATIONS

Chen et al., "A Comprehensive Approach to Modeling, Characterizing and Optimizing for Metastability in FPGAs", Proceedings of the ACM/SIGDA 18th International Symposium on Field Programmable Gate Arrays, pp. 167-176, Monterey, USA, Feb. 21-23, 2010.
Altera Corporation, "Quartus II Handbook", vol. 1, chapter 11, year 2004.
Beer et al., "The Devolution of Synchronizers", Proceedings of the The 16th IEEE International Symposium on Asynchronous Circuits and Systems (ASYNC), pp. 94-103, Grenoble, France, May 3-6, 2010.
Dike et al., "Miller and Noise Effects in a Synchronizing Flip-Flop", IEEE Journal of Solid-State Circuits, vol. 34, No. 06, pp. 849-855, Jun. 1999.
Alfke, P., "Metastable Delay in Virtex FPGAs", Xilinx Inc Forum, Mar. 28, 2008 http://forums.xilinx.com/t5/PLD-Blog/Metastable-Delay-in-Virtex-FPGAs/ba-p/7996.
Semiat et al., "Timing Measurements of Synchronization Circuits", Proceedings of the 9th International Symposium on Asynchronous Circuits and Systems (ASYNC'03), Vancouver, Canada, May 12-15, 2003.
VSYNC Circuits Ltd Brochure, May 28, 2011.
Zhou et al., "On-chip Measurement of Deep Metastability in Synchronizers", IEEE Journal of Solid-State Circuits, vol. 43, No. 2, pp. 550-557, Feb. 2008.
U.S. Appl. No. 13/191,487, filed Jul. 27, 2011.
Ginosar, R., "Fourteen Ways to Fool Your Synchronizer", Proceedings of the 9th International Symposium on Asynchronous Circuits and Systems (ASYNC'03), Vancouver, Canada, May 12-15, 2003.
Dobkin et al., "Fast Universal Synchronizers", International Workshop on Power and Timing Modeling, Optimization and Simulation (PATMOS), pp. 199-208, Lisbon, Portugal, Sep. 10-12, 2008.
U.S. Appl. No. 13/337,170, filed Dec. 26, 2011.
Dally et al., "Digital System Engineering", Cambridge University Press, 1998.
Kleeman et al., "Metastable Behavior in Digital Systems", IEEE Design and Test of Computers, pp. 4-19, Dec. 1987.
Chu et al., "A Design Methodology for Concurrent VLSI Systems", International Conference on Computer Design: VLSI in Computers, pp. 407-410, Port Chester, Oct. 7-10, 1985.
Dobkin, R., "Synchronization Issues in Multiple-Clock Domain Designs", ChipEx 2010, Airport City, Israel, May 4, 2010.
Kapschitz et al., "Formal Verification of Synchronizers", Proceedings of CHARME 2005 Conference, pp. 363-366, Saarbrucken, Germany, Oct. 3-6, 2005.
Brown, G.M., "Verification of a Data Synchronization Circuit for All Time", Proceedings of the Sixth International Conference on Application of Concurrency to System Design ( ACSD 2006), pp. 217-228, Turku, Finland, Jun. 28-30, 2006.
Bing et al., "Automatic Formal Verification of Clock Domain Crossing Signals", Proceedings of the 14th Asia and South Pacific Design Automation Conference (ASP-DAC 2009), pp. 654-659, Yokohama, Japan, Jan. 19-22, 2009.
Litterick et al., "Pragmatic Simulation-Based Verification of Clock Domain Crossing Signals and Jitter using SystemVerilog Assertions", Design and Verification Conference and Exhibition (DVCON'06), San Jose, USA, Feb. 22-24, 2006.
Dobkin et al., "Assertion Based Verification of Multiple-Clock GALS Systems", 16th International Conference on Very Large Scale Integration (VLSI-SOC), Rhodes Island, Greece, Oct. 13-15, 2008.
Kayam et al., "Symmetric Boost Synchronizer for Robust Low Voltage, Low Temperature Operation", Technical Report, Technion EE Department, year 2007.
Dobkin et a., "High Rate Data Synchronization in GALS SoCs", IEEE Transactions on VLSI, vol. 14, No. 10, pp. 1063-1074, 2006.
Dobkin et al., "Two Phase Synchronization with Sub-Cycle Latency", VLSI Integration Journal, vol. 42, No. 2, pp. 367-375, year 2009.
Jex et al., "A Fast resolving BiNMOS Synchronizer for Parallel Processor Interconnect", IEEE Journal of Solid-State Circuits, vol. 30, issue 2, pp. 133-139, Feb. 1995.
Aspen Logic Inc, "Managing Synchronizer MTBF", Aspen Logic Journal (v1.0), Feb. 25, 2009.
Synopsys Inc., "IC Compiler: the next-generation physical design system", Datasheet, year 2009.
Synopsys Inc., "DesignWare Intellectual Property: The Most Widely Used, Silicon-Proven IP", Datasheet, year 2010.
Synopsys Inc., "Leda: RTL Checker", year 2010.
Cadence Design Systems Inc., "Encounter Conformal Equivalence Checker", year 2011.
Axiom Design Automation, "About the company", year 2010 (www.athdl.com).
Real Intent Inc., "Clock Domain Crossing Demystified: The Second Generation Solution for CDC Verification", Whitepaper, Jun. 30, 2008.
Yeung, P., "Five Steps to Quality CDC Verification", Whitepaper, Mentor Graphics Corporation, year 2007.
Atrenta Inc., "SpyGlass CDC", year 2011.
Blue Pearl Software, "INDIGO: RTL Analysis", Sep. 14, 2006.
Yeager et al., "Congestion Estimation and Localization in FPGAs: A Visual Tool for Interconnect Prediction", 9th International Workshop on System-Level Interconnect Prediction (SLIP'07), Austin, USA, Mar. 17-18, 2007.
U.S. Appl. No. 13/191,487 Office Action dated Jun. 21, 2013.
U.S. Appl. No. 13/337,170 Office Acation dated Jun. 11, 2013.
Dey et al., "Time for a change: making clock-domain-crossing analysis usable and useful", Chip Design Magazine, 5 pages, Oct./Nov. 2010.

* cited by examiner

VLSI BLACK-BOX VERIFICATION

CROSS-REFERENCE TO RELATED APPLICATIONS

This application claims the benefit under 35 USC 119(e) of U.S. Provisional Patent Application 61/511,581, filed Jul. 26, 2011, and is a continuation in part of U.S. patent application Ser. No. 13/191,487, filed Jul. 27, 2011, and titled: "Static Analysis of VLSI Reliability," which claims the benefit of U.S. Provisional Patent Application 61/368,276, filed Jul. 28, 2010. The disclosures of these related applications are incorporated herein by reference.

FIELD OF THE INVENTION

The present invention relates generally to integrated circuits and particularly to design verification of integrated circuits.

BACKGROUND OF THE INVENTION

Integrated circuits have become very complex, sometimes including millions of transistors on a single chip. The processes currently used in production of integrated circuits allow for using very small transistors, which makes their design even more complex. It is therefore important to verify correctness of the design of integrated circuits.

Many elements of integrated circuits are synchronous elements which are timed by a clock signal. The faster the clock signal operates, the more operations are performed by the integrated circuit within a given time. There are, however, limitations on the speed at which circuits can operate and the clock signal therefore has to have a rate lower than the fastest rate allowed by the circuit. Different circuits are therefore designed at different rates. Some integrated circuits include sections which operate at different clock rates. A point at which circuits having different clock rates are interconnected is referred to as a clock domain crossing (CDC). Incorrect design of clock domain crossings may result in the entire integrated circuit not operating properly.

A paper titled: "A Comprehensive Approach to Modeling, Characterizing and Optimizing for Metastability in FPGAs", by Betz et al., the disclosure of which is incorporated herein by reference, presents a function for calculating a mean time between synchronization failures (MTBF) and requires that the MTBF be sufficiently long to avoid synchronization failures.

Integrated circuits are generally defined in a hardware definition language (HDL), which is compiled and converted into a circuit layout. In some cases, portions of the circuit are represented in the circuit description by a high level definition which does not include lower level details. Such portions are referred to as black-boxes. Black-boxes are used, for example, when it is desired to generate the high level circuit description before the details of the black-box are ready and/or when the black-box is purchased from an external vendor.

US patent publication 2010/0180240, to J. D. Davis, M. Budiu, H. Kannan, titled: Optimizing system-on-a-chip using the dynamic critical path, the disclosure of which is incorporated herein by reference, describes critical path optimization which performs simulations of circuits including black-boxes to assess latency or power, based on user provided information on the black-boxes, although the internal structure of the black-boxes is unknown.

U.S. Pat. No. 7,984,404 to K. T. Do, H. Kim, H. S. Son, Postech Academy-Industry Foundation, titled: "Black box timing modeling method and computer system for latch-based sub-system", the disclosure of which is incorporated herein by reference, discusses providing timing modeling (e.g. setup timing) for black-boxes, allowing faster timing analysis.

SUMMARY

Embodiments of the present invention that are described hereinbelow provide a circuit verifier, which scans circuits for clock domain crossing (CDC) problems, including CDCs associated with one or more black-boxes.

There is therefore provided in accordance with an embodiment of the present invention, a circuit verifier, including an input interface configured to receive descriptions of integrated circuits; and a processing unit configured to scan through a description of an integrated circuit received through the input interface in order to identify black-boxes in the description, to assign the identified black-boxes to clock domains and to identify clock domain crossings, in which a black-box assigned to a first clock domain is connected to an element belonging to a second clock domain.

Optionally, the processing unit is configured to assign the identified black-boxes to clock domains by generating a tree of clock signals of the integrated circuit and assigning each black-box with the clock domains of all the clock signals entering or exiting the black-box.

Optionally, the processing unit is configured to assign each of the ports of a black-box with a separate indication of the clock domains to which the port may belong.

The verifier optionally further includes a display and wherein the processing unit is configured to present on the display a list of ports of a black-box and receive from a user indications of the clock domains to which the ports belong. Optionally, the processing unit is configured to assign ports with a plurality of clock domains, when a specific clock domain to which the port belongs is unknown. Optionally, the processing unit is configured to retrieve for identified black-boxes previously stored models which indicate the clock domains to which the ports of the black-box belong. Optionally, the processing unit is configured to retrieve the previously stored models from a remote server over the Internet. Optionally, the processing unit is configured to collect information on internal connections between ports of black-boxes and to identify clock domain crossings along a path passing through a black-box. Optionally, the processing unit is configured to collect information on internal connections between ports of black-boxes from parameters assigned to the instance of the black-box in the received circuit.

There is further provided in accordance with an embodiment of the present invention, a method of verifying a circuit, comprising receiving a description of an integrated circuit, by a processing unit, scanning the description by the processing unit, to identify black-boxes in the description, assigning the black-boxes to clock domains, identifying clock domain crossings in which a black-box belonging to a first clock domain is connected to an element belonging to a second clock domain; and presenting a list of identified clock domain crossings in the circuit to a user.

Optionally, assigning the black-boxes to clock domains comprises generating a tree of the clock signals of the received description and assigning each black-box to clock signals entering the black-box in the tree. Optionally, assigning the black-boxes to clock domains comprises designating each port of the black-boxes with a separate clock domain indication. Optionally, assigning the black-boxes to clock domains comprises receiving from a user through a user interface, indications of the clock domains to which ports of the black-boxes belong. Optionally, assigning the black-boxes to clock domains comprises receiving from a user indications of relations between ports of a black-box. Optionally, assigning the black-boxes to clock domains comprises accessing a repository of black box models, retrieving from the repository models of black boxes in the integrated circuit and assigning the clock domains using information in the models.

There is further provided in accordance with an embodiment of the present invention, a method of scanning a circuit for clock domain crossings, including receiving a description of an integrated circuit, by a processing unit, identifying in the received circuit sub-units which are to be analyzed separately, generating for the identified sub-units a model indicating the clock domain to which each port of the sub-unit belongs, replacing the identified sub-units in the circuit by black-boxes associated with the respective generated models, so as to generate a revised circuit, scanning the sub-units for possible problematic clock domain crossings, scanning the revised circuit for possible problematic clock domain crossings and providing the results of the scanning of the sub-units and of the revised circuit to a user.

Optionally, identifying the sub-units comprises selecting a set of sub-units estimated to reduce the processing resources required to scan the circuit for clock domain crossings. Optionally, generating the model includes indicating for each sub-unit the internal connections of the ports of the sub-unit.

DETAILED DESCRIPTION OF EMBODIMENTS

An aspect of some embodiments of the invention relates to an integrated circuit verifier configured to assign block-boxes to clock domains and to identify clock domain crossings (CDCs) in which black-boxes are involved.

In some embodiments of the invention, the verifier allows assignment of a plurality of clock domains in the alternative to a single black-box in order to cover the possible alternatives. Alternatively or additionally, the verifier allows indication of a black-box as not belonging to a clock domain, such that its clock domain list is empty.

Optionally, each port of the black-box is assigned a separate clock-domain indication. Thus, each of the ports can be evaluated on its own as belonging to a single clock domain or a limited group of clock domains and not according to all the clock domains of its black-box.

The verifier optionally includes a user interface which is adapted to receive information on ports of black-boxes from a human user. In some embodiments of the invention, the verifier is configured to automatically determine the black-boxes in a circuit, the ports of the black-boxes and/or attributes of the ports, and request from the user to provide additional information on the ports.

System Overview

Figure 1:
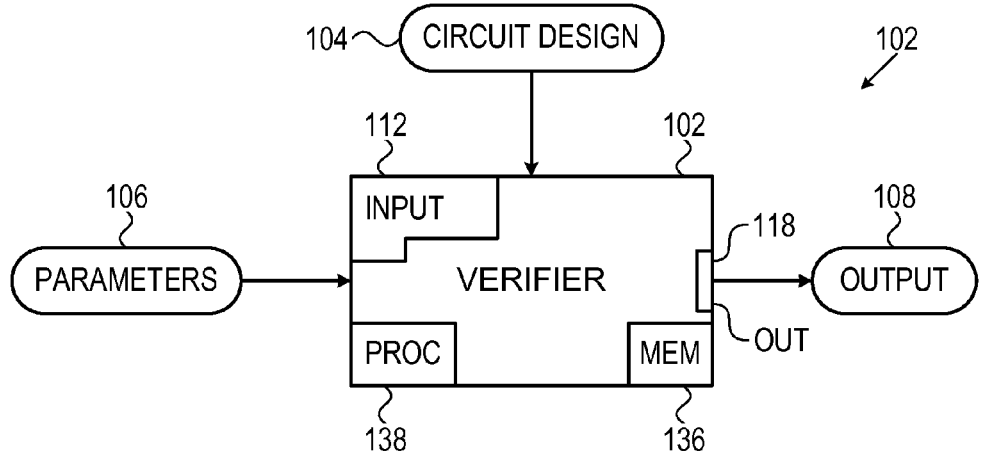
FIG. 1 is a schematic block diagram of a circuit analysis system, in accordance with an embodiment of the invention.

FIG. 1 is a schematic block diagram of a VLSI analysis system 100, in accordance with an embodiment of the invention. System 100 comprises a verifier 102 which receives, through an input interface 112, a design 104 of a circuit to be verified. Verifier 102 also receives parameters 106 of the circuit design, such as clock rates, port data rates, operating conditions and target technology attributes, and provides, through an output interface 118, an output 108 indicating possible untreated clock domain crossings, suggestions on how to improve the design and/or a corrected circuit. In some embodiments, the output 108 includes an indication of the reliability of the received circuit design 104.

Design 104 is optionally received as a description in a hardware definition language (HDL) such as Verilog, VHDL, System Verilog, AHDL (Altera Hardware Description Language), iHDL and/or system-C. The description is optionally received in a register transfer level (RTL) or in a netlist or gate level. The integrated circuit may be of substantially any type, including ASIC (Application Specific Integrated circuit), FPGA (Field Programmable Gate Array) and CPLD (Complex Programmable Logic Device).

Verifier 102 typically comprises a general-purpose computer or a cluster of such computers, with suitable interfaces, one or more processors 138, and software for carrying out the functions that are described herein, stored, for example, in a memory 136. The software may be downloaded to the computer in electronic form, over a network, for example. Alternatively or additionally, the software may be held on tangible, non-transitory storage media, such as optical, magnetic, or electronic memory media. Further alternatively or additionally, at least some of the functions of verifier 102 may be performed by dedicated or programmable hardware logic circuits. For the sake of simplicity and clarity, only those elements of verifier 102 that are essential to an understanding of the present invention are shown in the figures.

Figure 2:
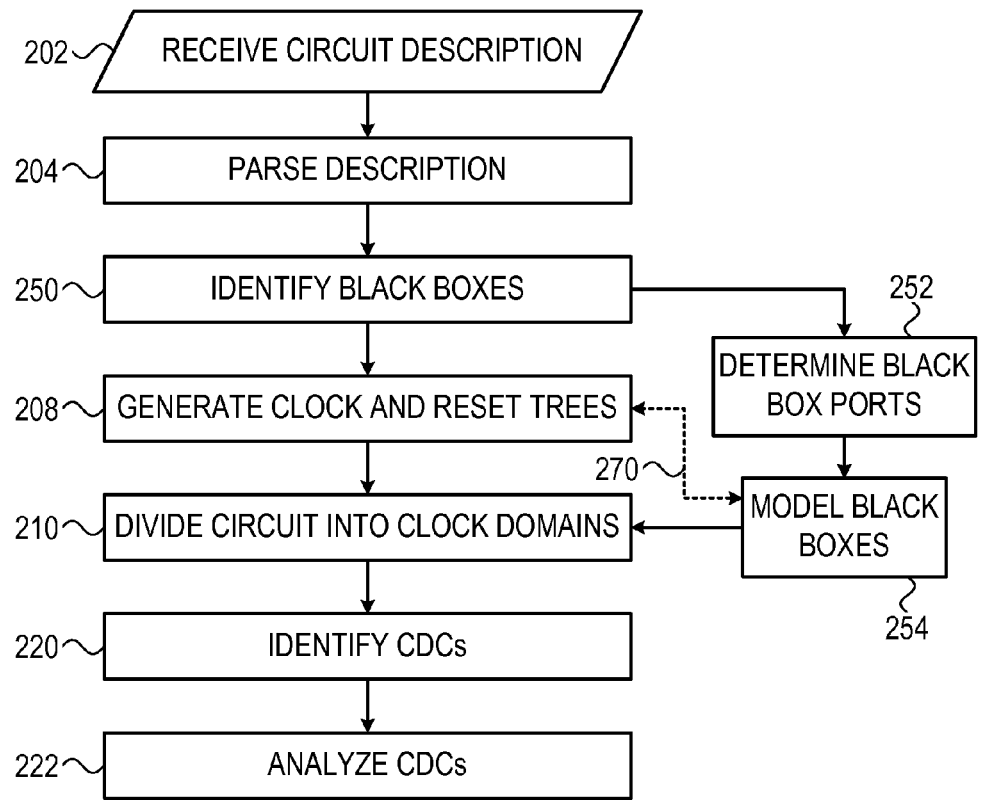
FIG. 2 is a flowchart of acts performed by a circuit verifier, in accordance with one embodiment of the invention.

FIG. 2 is a flowchart of acts performed by verifier 102 in verifying an integrated circuit, in accordance with an embodiment of the invention. Upon receiving (202) a HDL description of a circuit design, verifier 102 parses (204) the HDL description into a searchable graph. The parsing may be performed using any suitable method known in the art, such as described in US patent publication 2004/0225974, U.S. Pat. No. 6,169,968 to Kabuo or U.S. Pat. No. 5,870,308 to Dangelo et al., the disclosures of which are incorporated herein by reference in their entirety. The parsing optionally includes identifying sequential elements, which are elements to which a clock signal enters, such as registers, flip-flops and latches.

In accordance with embodiments of the present invention, the parsing includes identifying (250) black-boxes, which are circuit objects for which the parsed HDL does not include complete structure details, e.g., Register transfer level (RTL) and/or netlist or gate level (GL) details are not provided. For each black box, the ports of the black box are determined (252), for example from the HDL description. Parameters of the ports may be determined along with the ports, from the HDL description. In some embodiments, attributes of the ports and/or connections between the ports are determined in a stage referred to herein as black box modeling (254). As discussed in detail herein below, the modeling (254) of a black-box is optionally performed using one or more of analysis based on the structure of the received circuit design outside the black-box, metadata provided with the black-box and user input. In some embodiments, the modeling uses a combination of the above methods, for example automatically collecting any available modeling information, presenting the collected information to the user and receiving from the user corrections and/or additions.

Clock and reset trees are optionally generated (208) for the received circuit description, associating synchronous data lines and sequential data elements with respective clock sources. The circuit is divided (210) into areas according to the clock source that controls the operation of the elements in the area. An area including elements controlled by a specific clock source is referred to herein as the clock domain of the clock source.

Clock domain crossings (CDCs) are identified (220) by finding data lines belonging to a first clock domain, entering synchronous elements belonging to a different clock domain. The CDC identification includes, in addition to identifying CDCs not related to black-boxes, identifying CDCs in which one or both of the elements involved is a port of a black-box, and CDCs passing through black-boxes, as discussed in detail hereinbelow.

The identified clock domain crossings are analyzed (222) to determine their structure and whether the structure is sufficient to prevent errors in the operation of the clock domain crossing.

The details of the method of FIG. 2, not related to black-boxes may be performed using methods known in the art and/or using methods described in U.S. patent application Ser. No. 13/191,487, filed Jul. 27, 2011 and titled: "Static Analysis of VLSI Reliability".

Tree Generation and Clock Domain Assignment

As to generating (208) the clock and reset trees, in some embodiments of the invention, verifier 102 reviews the parsed HDL, identifies clock and reset lines and generates a tree therefrom. Optionally, verifier 102 scans the elements of the circuit for elements having input reset and clock ports and back traverses from these ports to identify their sources, and connections between them. The back traversing optionally passes on plain lines, inverters and buffers. When a more complex element is reached, the port of the element that is reached is defined as a source of the clock or reset signal. Similarly, if an external pin of the circuit is reached, the pin is defined a source of the clock or reset signal. When a port of a black-box is reached in the back traversing, the port is defined as a source of the clock or reset signal. It is noted, however, that if the current model of the black-box indicates a suitable connection between the port reached in the back traversing and another port of the black-box, the back traversing may proceed through the black-box. The verifier optionally additionally forward propagates from the identified sources, indicating sequential elements and black-box ports to which the clock and reset lines reach as leaves of the tree. When reaching a first port of a black-box during forward propagation, the black-box is indicated as a leaf of the tree. If the block box model indicates one or more of the other ports of the black box as related to the first port, the forward propagation optionally proceeds through the black-box.

It is noted that the black-box model may indicate two or more ports as having a simple pass through relation or may indicate a more complex relation, such as that the black-box serves as a clock gate, clock multiplier and/or clock divider between the ports and/or that the two ports are related with a specific phase and/or polarity change. When the connection between the ports of the black box is a direct connection, the ports are considered to relate to the same signal. When the connection between the ports is indicated to be a more complex connection, such as a clock rate change, the other port is marked as a different signal, related to the signal of the port that was reached in the back traversing.

Once the clock signal tree is completed as best as achievable, the elements of the circuit are divided (210) into clock domains. Each element is assigned to a clock domain according to the clock signal, as identified by its source, entering the element. Black-boxes are associated with all the clock signals entering the black-box. Clock ports of black-boxes are associated with the clock domain of the clock signal entering the port. Further assignment of ports of the black-box is discussed hereinbelow after describing the black-box modeling (254).

The Modeling

The modeling of a black box optionally includes some or all of the following:

The direction, type and/or clock domain of each port of the black box, such that it is possible to determine whether a connection of the port to another element of the circuit, external to the black-box, forms a clock domain crossing.

Internal connections between ports of the black box and the types of the connections, such that it is possible to determine cases in which two elements external to the black box form a clock domain crossing due to a connection through the black box. In addition, the internal connections between ports may be used in determining cases of re-convergence.

Internal CDCs which do not effect ports of the black-box, the knowledge of which may be used to assess the reliability of the circuit.

In accordance with some embodiments of the invention, in the modeling (254), for each black-box, each port of the black box is assigned a separate clock domain indication. Optionally, in order to handle cases in which information is not available, the clock domain indications may include a plurality of clock domains. When the clock domain of a port is known, the port is optionally associated with a single clock domain, while when the clock domain is unknown the port may be associated with a plurality of possible clock domains, possibly all the clock domains of clock signals entering the black-box. It is noted that a black-box port or even an entire black-box may be marked as not relating to any clock domain, meaning that the black-box or a portion thereof connecting to one or more ports is formed of pure combinatorial logic and is not clock controlled.

Alternatively, for example when there is insufficient information about the ports of a black box, a single clock domain record is defined for the entire black-box.

The modeling (254) of a black-box is optionally performed using one or more of analysis based on the structure of the received circuit design outside the black-box, metadata provided with the black-box, hints on the internal structure of the black-box provided with the circuit and user input. In some embodiments, the modeling uses a combination of the above methods, for example automatically collecting any available modeling information, presenting the collected information to the user and receiving from the user corrections and/or additions.

In some embodiments of the invention, the modeling (254) is performed by first automatically determining information from the received circuit design (e.g., external connections of the black-box in the circuit design and/or internal structure hints) and/or from metadata, provided with the black-box and/or with the circuit, and then querying the user for corrections and/or additional information.

In some embodiments, the modeling includes a plurality of automatic determination stages performed before and after one or more user input stages. For example, a first automatic stage determines the ports and thereafter a first stage of input from the user is performed. Then, based on the user input another automatic determination stage is performed. In some embodiments, another user input stage may then be performed, etc. Alternatively or additionally, during a user input stage, every time the user enters additional information, verifier 102 automatically checks what additional information can be determined based on the user input, as indicated by arrow 270 in FIG. 2. For example, each time a connection between ports of a black-box is indicated, verifier 102 optionally automatically determines whether the clock signal spanning tree can be updated.

Automatic Determination

Optionally, the automatic determination includes determining the ports of the black-box, for example based on the external connections of the black-box in the circuit. In some embodiments of the invention, the automatic determination additionally includes determining the nature of the ports, such as their type (e.g., clock, data, reset) and/or their direction (e.g., in, out, in-out).

In some embodiments, based on the generated clock and reset trees, ports of the black-box that connect to a reset tree are considered reset ports, ports connected to a clock tree are considered clock ports and the remaining ports are considered data ports. Alternatively, ports connected to data ports of other elements are indicated as data ports and the remaining ports are marked as of an unknown type.

Ports receiving a signal line which comes out of a known element are indicated as incoming ports. Ports connecting to inputs of known circuit elements are considered output ports. For example, a port connected to a signal line connected to a register is determined as an input or output port depending on where in the register the line connects. Alternatively or additionally, the circuit description (e.g., VHDL description) may include port direction indications.

The clock ports are optionally assigned the specific respective clock signals to which they are connected. Optionally, the black-box is assigned the clock domains of all the clock signals entering the black box. Clock signals are considered entering a black-box if they are connected to an input port or in-out port of the black box. Optionally, if the direction of a port (e.g., an input port or output port) is unknown, it is handled as an in-out port as a precaution. In some embodiments of the invention, the black-box is also assigned the clock domains of clock signals exiting the black-box, as such clock signals may be generated within the black-box and used for one or more of the ports in the black-box.

Data ports having an unknown clock domain are optionally assigned in the automatic assignment stage all the clock domains of their black-box. This is used as a precaution to make sure all possible circuit domain crossings are identified.

Optionally, black-boxes not connected to any clock sources are assumed to be asynchronous (i.e., operate without clock signals).

In some embodiments, the automatic determination includes extraction of other information from the circuit description. For example, in some cases the circuit RTL description identifies the black-box by a name and one or more additional parameters which indicate specific attributes of the black-box type identified by the name. One or more of the black-box parameters may imply information which may be used in modeling the black-box. For example, a parameter which indicates a relation between two ports of a black-box, such as a clock rate ratio, implies that the two ports are connected through a clock-rate-changing circuit. Verifier 102 optionally checks the black-box for such parameters and accordingly determines internal connections between ports of the black-box.

User Input

In the user input stage, verifier 102 presents to the user, for some or all of the black boxes, the ports of the black box and receives from the user indications of attributes and/or connections between the ports, as is now described with reference to FIG. 3.

Figure 3:
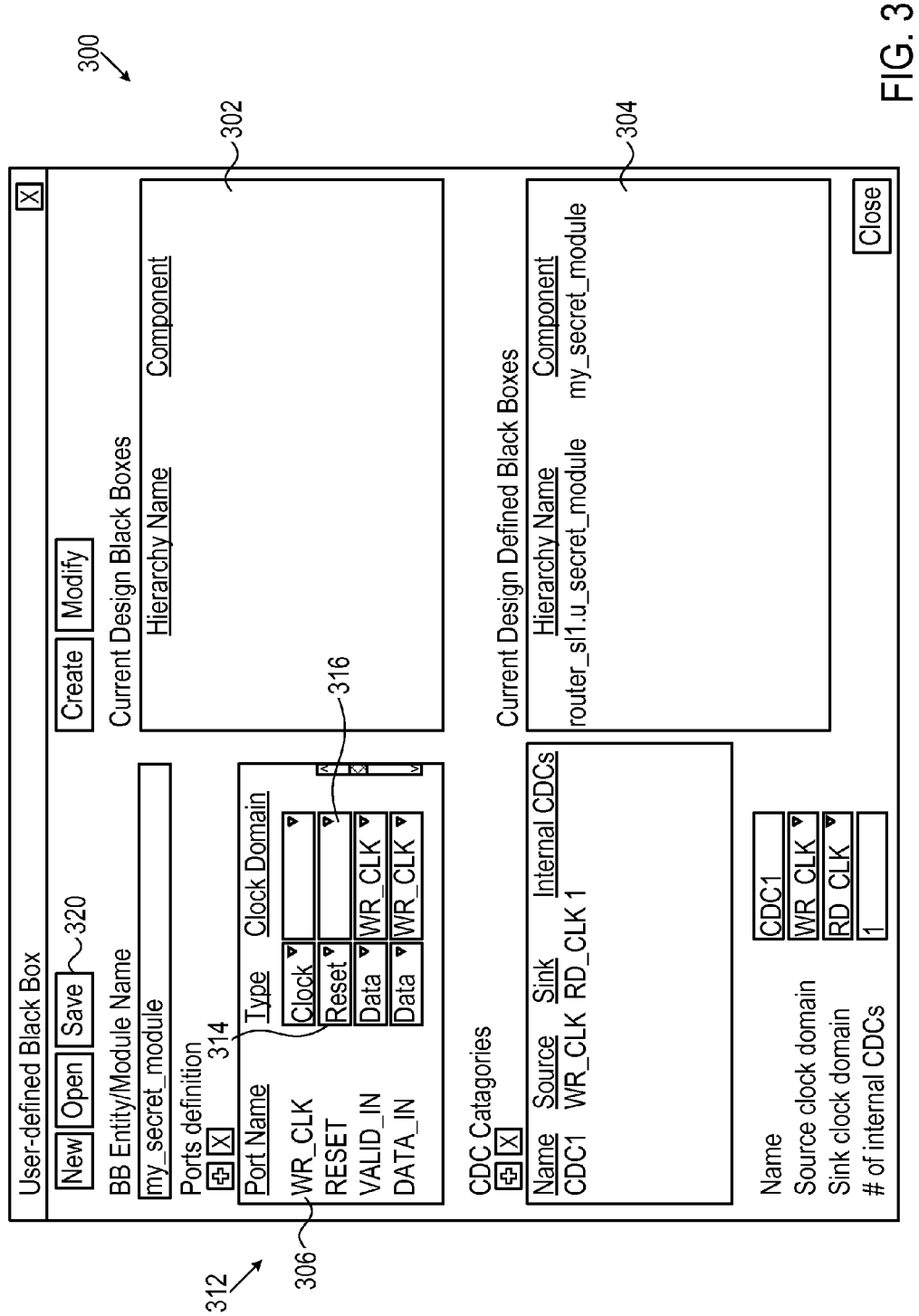
FIG. 3 is a schematic illustration of a graphic user interface (GUI) for modeling black boxes, in accordance with an embodiment of the invention.

FIG. 3 is a schematic illustration of a graphic user interface (GUI) 300 for modeling (254) black boxes, in accordance with an embodiment of the invention. GUI 300 optionally includes a window 302 listing black boxes whose ports were not yet identified and a window 304 listing black boxes that were identified. Upon selecting a black box from the list in window 302, a list of the currently known ports of the selected black box is presented in a window 306. The user may optionally add and/or remove ports if the automatic generation of the list was incorrect. For each port, the list optionally includes a line 312 including a type field 314 for indicating the type of the port (e.g., clock, reset, data, control) and a clock domain field 316 for indicating the clock domain to which the port belongs. Additional fields may be used for indicating the direction of the port (e.g., input, output, in-out) and/or a bus width for multi-bit ports.

In some embodiments of the invention, the user may define additional clock signals not identified automatically by verifier 102. Particularly, the user may indicate clock signals generated within black-boxes, referred to herein as virtual clocks, and the user may define black-box ports as belonging to virtual clock signals in the same way a port is indicated as belonging to the domain of a regular clock signal known from the circuit external to the black-box. In addition, if information is available, the user may define the rates of the virtual clocks and/or the relationship between the virtual clocks and other clock signals, virtual and non-virtual. In addition, the clock indication of a port may optionally be indicated as "asynchronous", when not governed by a clock signal. Optionally, the user is allowed to indicate black-box ports as don't-care ports, not to be checked for CDCs by verifier 102.

GUI 300 optionally also allows the user to indicate relations between ports, indicating which ports are connected to each other and possibly the nature of the relation. Particularly, the user may indicate ports which are directly connected, without passing through synchronous elements (e.g., registers, flip-flops), such that the black-box serves as a bypass connecting the input port to the output port. The user optionally may indicate more complex relations between two ports of a black-box, for example indicating a phase and/or polarity relation between the ports or that one port carries a clock signal having a rate which is a multiplication of a clock signal of another port. Optionally, the user may indicate relations between clock signals, for example indicating clock signals that operate at the same rate and/or a known ratio between clock rates of pairs of clock signals.

Optionally, the user may also provide other information included in the black-box model, for black-boxes listed in windows 302 and/or 304, such as information on internal clock domain crossings such as their number and operation rates, and possibly their synchronization circuits which are not seen at any of the ports of the black-box.

In some embodiments of the invention, the user may also indicate output ports of the black-box that are affected by internal cross domain crossings (CDCs) and/or by synchronization circuits of the CDCs and therefore have a non-deterministic timing. These ports are referred to herein as SyncOut ports. Optionally, the user may indicate that one port is a synchronization of another port or that a port is synchronized without stating its relation to another port. Alternatively or additionally, the user may indicate ports which are not SyncOut ports.

The information on SyncOut ports is optionally used by verifier 102 to identify reconvergence paths. In determining possibly problematic reconvergence paths for black-boxes, verifier 102 optionally identifies cases in which data signals from two or more output SyncOut ports of one or more black-boxes lead to a single element where they converge. In some embodiments of the invention, possibly problematic reconvergence paths are indicated only when it is known that the signals of both the ports of the reconvergence path originate from a same element. In other embodiments, a possible problem is indicated unless it is known that the signals of the reconverging ports do not come from a single element. In some embodiments, the user may set the extent of warnings generated by verifier 102. The search for reconvergence paths is optionally performed using a deep first search (DFS) method, although other methods known in the art may be used.

A save button 320 is optionally used to save the entered information and move black boxes from unidentified window 302 to identified window 304. Optionally, the user may select black boxes in identified window 304 and change their data.

The user may determine the provided port information based on documentation of the black-box or from any other sources, such as the user's understanding of the circuit operation. In some embodiments of the invention, the user determines the structure information of the black-box from a timing model of the black-box provided by the black-box vendor.

In some embodiments, in addition to displaying a list of ports, GUI 300 displays any available information on the ports which was previously determined automatically from the circuit design, in a previous user input session, from a previous stored modeling of the black-box and/or any other source. Optionally, automatically generated information is presented to the user with a confidence marking which indicates the confidence that the information is correct. The confidence markings are optionally generated automatically by verifier 102 according to the source of the information. Alternatively or additionally, confidence markings may be provided by the user. Based on the presented confidence markings the user can decide which information requires more attention.

Verifier 102 optionally checks the information provided by the user to verify its correctness. For example, the user input may be checked to make sure it does not include deadlocks and/or that the clock rates provided are reasonable.

Model Storage

In some embodiments of the invention, when the modeling of a black-box is completed, the model is stored as a phantom model to be used for other instances of the black-box in the present circuit and/or in other circuits. Optionally, the models of commonly used black-boxes are uploaded to a sharing web-site, for example managed by a producer of verifier 102 and/or a producer of the black-box. In handling other circuits, verifier 102 optionally accesses the website in order to search for previously stored phantom models for the black-boxes of the circuit. Alternatively or additionally, producers of black-boxes may supply phantom models with the black-boxes they supply. In storing the model, verifier 102 optionally differentiates between general information of the model which is stored in the model as global information and specific information determined for a specific instance of the black-box which is not stored in the model at all or is stored along with a condition stating when it is applicable.

In some embodiments of the invention, when a black-box has different internal structures depending on one or more parameters such as bus width, separate models are defined for the black-box for each parameter value. Verifier 102 uses the parameter of the black-box in the specific circuit to select the model to be used.

Optionally, in storing and retrieving models, each black-box is identified by a unique name and values of parameters which effect the model of the black-box. In some embodiments, before storing a model, the parameters of the black-box are displayed to the user and the user indicates which parameters are relevant to the model. Alternatively or additionally, verifier 102 is configured with a list of general types of black-boxes which indicates which parameters affect the model. The determination of which parameters are stored with the model is made automatically by consulting the list. In some embodiments, when in doubt, the model is stored with parameter values which possibly do not relate to the model and when retrieving a model, the retriever determines whether the model matches the black-box in the circuit.

For example, in the automatic modeling of black-boxes, verifier 102 optionally retrieves the names of the black-boxes in the circuit and their parameters and consults a model storage unit for matching models. When an exact match for a specific black-box is not found, the storage unit optionally provides models of the specific black-box with similar parameter values and the requesting verifier 102, possibly with the aid of a human user, determines whether the values that are different are meaningful to the model or not.

CDC Identification

As to identifying CDCs (220), the identification is optionally performed by determining all the paths between pairs of sequential elements (e.g., sequential logic element, black box, external port), and indicating a possible CDC for pairs in which the sequential elements belong to different clock domains. Black boxes belonging to at least one clock domain are considered as sequential elements. The pairs reviewed include connections from black-boxes to other sequential elements, from other sequential elements to black-boxes and from black-boxes to other black-boxes. Optionally, the pairs reviewed also include sequential elements connected through a bypass or combinatorial connection between ports of a black-box.

In some embodiments of the invention, the identification includes reviewing all objects in the circuit which could be sources of a CDC, e.g., sequential logic elements, and output ports (including in-out ports) of black boxes, and for each possible source object checking its forward combinatorial connections to see if they lead to an object belonging to a different clock domain. Alternatively or additionally, the identification (220) includes reviewing all objects in the circuit which could be sinks of a CDC, e.g., sequential logic elements, input ports of black boxes (including input-output ports), and for each possible sink object checking its backward combinatorial connections to see if they are in a different clock domain.

Optionally, for ports of black-boxes not assigned separate clock domain indications, the clock domain of the entire black-box is used for that port. It is noted that in some embodiments, verifier 102 can operate with different levels of information, providing warnings according to the available information. For example, verifier 102 can perform its verification using only minimal information on the black-boxes determined from the circuit and can perform its verification using complete modeling information.

Optionally, identifying the CDCs (220) takes into account direction information of black-box ports, when available.

When a port of a block-box is marked as an input port, the port is forward traversed only in the direction into the black-box, while output ports are forward traversed out of the black-box. Ports marked as in-out ports are traversed in both directions. By default, ports are optionally considered as in-out ports unless marked otherwise.

Optionally, for black-boxes belonging to more than one clock domain, the pair is considered as a possible CDC, even if both the sequential elements are associated with the same plurality of clock domains, as the inner structure of the black-boxes is unknown and the clock domain of an internal element closest to the connection may be different from the clock domain of the other element. When, however, ports of a black-box are marked with specific clock domain information, the question of whether there is a CDC is optionally determined for each port of the black-box according to its specific clock domain. Asynchronous and/or don't-care ports of black-boxes are optionally not considered in identifying CDCs.

Figure 4A:
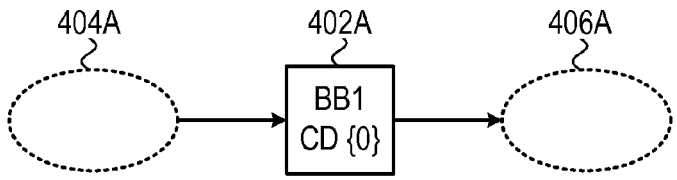
FIGS. 4A-4E are schematic illustrations of element arrangements including black boxes 402A-402E, and their consideration as possible clock domain crossings, in accordance with an embodiment of the invention.
Figure 4B:
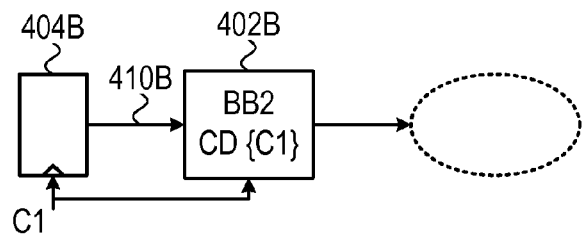
Figure 4C:
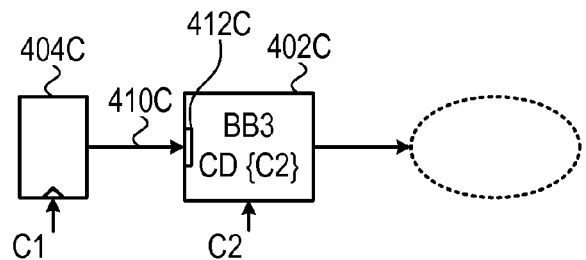

FIGS. 4A-4E are schematic illustrations of element arrangements including black boxes 402A-402E, and their consideration as possible clock domain crossings, in accordance with an embodiment of the invention. In FIG. 4A, no clock signal enters black box 402A. Therefore, the connection between black-box 402 and adjacent circuits 404A and 406A are not considered to include a possible CDC. In FIG. 4B, only a single clock signal enters black-box 402B and therefore the black-box 402B is assigned to the clock domain of the entering clock signal c1. Data line 410B coming from the neighboring circuit 404B is not considered a possible CDC since both black-box 402B and neighboring circuit 404B belong to clock domain c1. In FIG. 4C there is a possible CDC on line 410C, since the clock signal c2 entering black-box 402C, the sink of line 410C, is different from the clock signal c1 entering neighboring circuit 404C, which is the source of line 410C. It is noted, however, that if the user marked port 412C of black-box 402C as not belonging to a clock domain, then data line 410C is not considered a possible CDC.

Figure 4D:
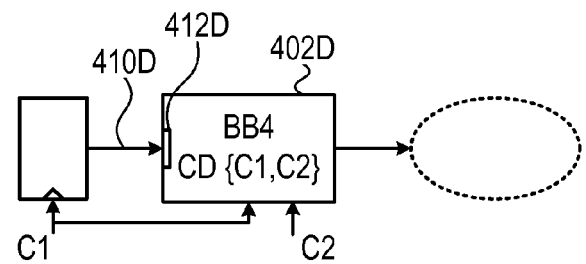
Figure 4E:
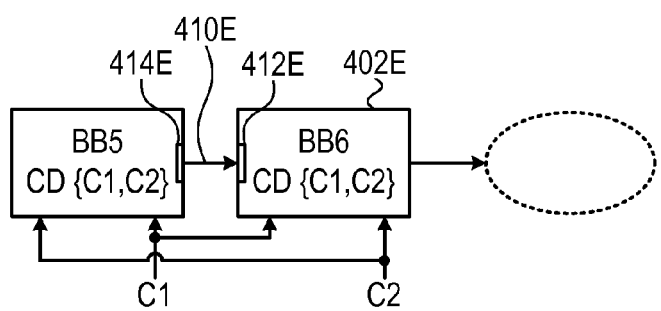

In FIGS. 4D and 4E, black-boxes 402D and 402E are considered to have a possible CDC with their neighboring circuits 404D and 404E along lines 410D and 410E, since a plurality of clock signals enter the black-boxes 402D and 402E. If, however, port 412D is marked by the user as belonging to clock domain c1, a CDC is not defined on line 410D. Similarly, if both of ports 412E and 414E are marked as belonging to the same clock domain (c1 or c2), data line 410E is not considered as a possible CDC.

Optionally, in addition to each port of a black-box being assigned a separate clock domain field, the entire black-box is assigned a list of clock domains including the clock domains of all its ports. In searching for clock domain crossings, the search is optionally performed in a hierarchical manner beginning from the highest layer. If a black-box is assigned to a single domain, the connections of the black-box can be checked for possible CDCs based on the clock domain of the entire black-box and there is no need to check each port separately. Only if the black-box is assigned a plurality of clock domains is the search for CDCs performed at the port resolution. In some embodiments, the clock domain field of the entire black box includes an indication of whether there are ports of the black-box that are assigned to only a single clock domain. In checking for CDCs for a black-box assigned a plurality of clock domains, the checking is optionally performed at the port level only if there is an indication that at least one port is assigned to a single or to no clock domain.

As to analyzing (222) the identified clock domain crossings, the analysis optionally includes for general CDCs not necessarily relating to a black box, determining whether the clock domain crossings have synchronization circuits and verification of whether the structures of the synchronization circuits are sufficient to reduce the risk of failure to below a desired level. In some embodiments of the invention, the analysis includes calculating the expected failure rate of clock domain crossings and/or of the entire circuit. In some embodiments of the invention, verifier 102 additionally provides recommendations which can improve the expected failure rate. Verifier 102 optionally evaluates CDCs and provides them scores based on comparison of the specific CDCs to a library of CDC templates having associated scores. Alternatively or additionally, verifier 102 evaluates CDCs by rule based identification, which includes checking which rules from a list of rules are met by each specific CDC and accordingly assigning the score.

The CDCs that do not agree to the rules of correct CDC or agree to the rules of the incorrect CDC are reported to the user as problematic CDCs and are subject for design changes. The user might also decide to mark a reported CDC as a false path, indicating the path should be ignored by verifier 102, when according to the user analysis the reported CDC can be disregarded.

When a CDC is identified between a black-box and one or more external elements, verifier 102 optionally determines whether a synchronization circuit for the CDC is located outside the black box. If a synchronization circuit is identified, the synchronization circuit is optionally analyzed as discussed above. Verifier 102 optionally also checks whether the model of the black-box indicates that a synchronization circuit for the CDC, for example based on the port involved, has a synchronization circuit within the black box. Alerts are optionally provided to the user for CDCs for which a synchronization circuit was not found. For synchronization circuits within black-boxes, a model associated with the black-box may provide a description of the synchronization circuit and/or a reliability score for the synchronization circuit. Alternatively or additionally, the user may be queried for information on the synchronization circuits within black-boxes.

In some cases, in which a block-box is involved in a CDC, the structure of the CDC and its synchronization circuit are not necessarily known. In such cases, if classification is not possible it is left to the user to verify that the CDC is properly handled.

In some embodiments of the invention, the user is prompted to provide a default score for CDCs having unknown parameters and these default scores are used in evaluating the total CDC score of the circuit. In some embodiments of the invention, verifier 102 counts the number of CDCs within black-boxes in the circuit and uses the number in estimating a reliability score for the circuit, absent more accurate information on the details of the synchronization circuits.

The recommendations may be provided to the user who is required to generate corrected circuits. Alternatively, in a semi-automatic process, verifier 102 or a circuit builder connected thereto, either on a same processor or on a different processor, generates a corrected circuit patch based on the recommendations. The user then can take the generated corrected circuit patch and insert it into the integrated circuit instead of the erroneous circuit portion. In other embodiments, the process of generating the correction circuit patch and inserting it into the integrated circuit is completely automatic, at most requiring a few user acknowledgements. When dealing with a CDC in a block-box, the correction circuit is optionally added to the circuit at the interface with the black-box, without altering the black-box.

Verifier 102 may be used at one or more points during the design of a circuit. It may be used after the RTL design, after RTL verification and synthesis and/or after place and route design. In some embodiments of the invention, verifier 102 is applied to a designed integrated circuit by a human user at one or more stages during the design of the circuit. Alternatively, verifier 102 may operate in the background of a circuit design software and operate automatically, periodically or when substantial changes are made to a design. Optionally, after verifier 102 provides recommendations, verifier 102 monitors the changes made to the design until the circuit is determined to be error-free.

Hierarchical Design Analysis

In the above description, modeling information is used in order to overcome lack of information on circuit areas included in black-boxes. It is noted that modeling information may also be used for abstraction in order to simplify the operation of verifier 102, as is now explained with reference to FIG. 5.

Figure 5:
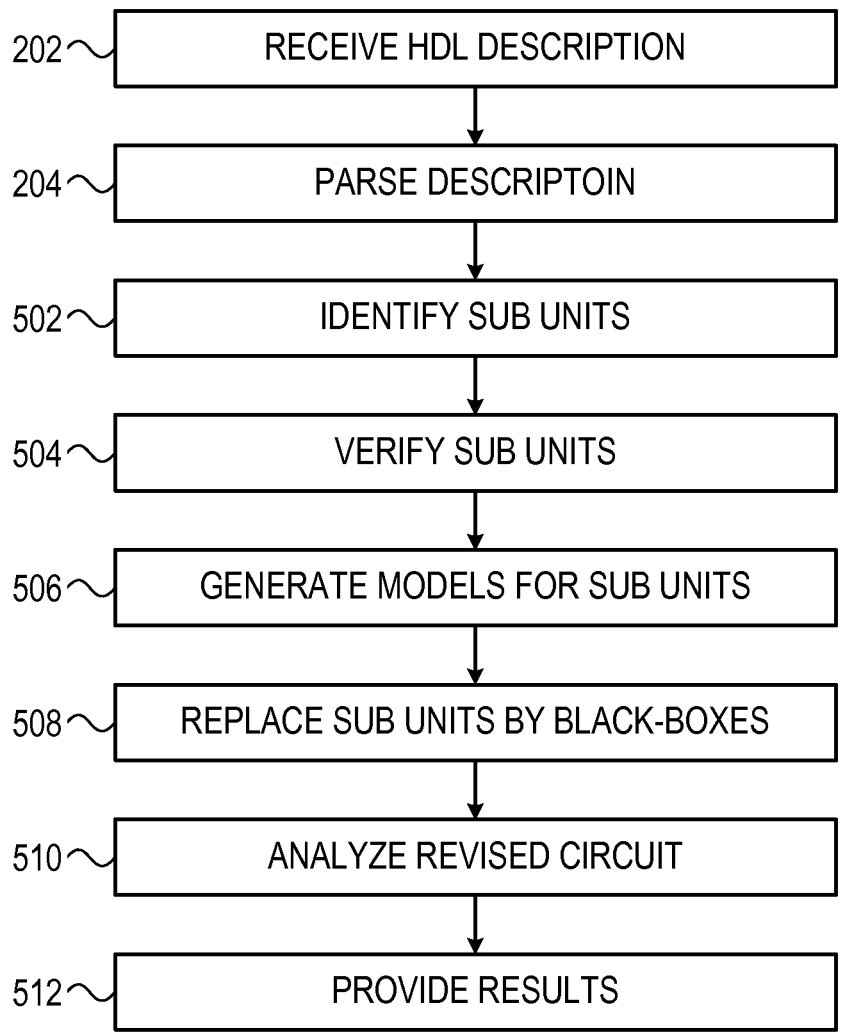
FIG. 5 is a flowchart of acts performed by a circuit verifier, in accordance with another embodiment of the invention.

FIG. 5 is a flowchart of acts performed by verifier 102, in accordance with an embodiment of the invention. Upon receiving (202) a HDL description of a circuit design, verifier 102 parses (204) the HDL description into a searchable graph and proceeds to identify (502) in the circuit sub-units which can be analyzed on their own and modeled for verification of the entire circuit. Optionally, the sub-units are identified from the floor planning of the circuit and/or from a hierarchy breakdown of the circuit. Alternatively or additionally, verifier 102 prompts the user to indicate the sub-units.

In some embodiments of the invention, the number of sub-units is selected according to the complexity of the circuit. Optionally, verifier 102 estimates the time required to analyze the circuit without breaking it down into sub-units and according to user instructions or predetermined rules decides how many sub-units to extract. The estimation of the required analysis time may be repeated one or more additional time to determine if additional sub-units should be defined.

Each identified sub-unit is verified (504) on its own, in accordance with any of the embodiments described above, providing the user with warnings, suggested corrections and/or ratings for the sub-unit. Verifier 102 also generates (506) for each sub-unit, a model of the circuit of the sub-unit which indicates the clock domain of each of the ports of the sub-unit, connections between ports and any of the additional information mentioned hereinabove.

The sub-units are replaced (508) in the circuit by black-boxes associated with respective models to generate a revised circuit and then verifier analyzes (510) the revised circuit. The user is provided (512) with the output results of the verification (504) of the sub-units together with the results of the verification of the revised circuit. By handling the sub-units separately, the processing resources required for the clock domain crossing verification are substantially reduced.

CONCLUSION

Black-boxes may be included in the circuit for various reasons, including secrecy and parallel development of the circuit and the details of the black-box. Another reason is reducing the complexity of circuits by abstraction.

In some embodiments of the invention, a human user may set parameters of the operation of verifier 102, for example the maximal length of paths to be checked for reconvergence. The length is optionally stated in terms of a number of elements.

It will be appreciated that the above described methods and apparatus are to be interpreted as including apparatus for carrying out the methods and methods of using the apparatus. It should be understood that features and/or steps described with respect to one embodiment may sometimes be used with other embodiments and that not all embodiments of the invention have all of the features and/or steps shown in a particular figure or described with respect to one of the specific embodiments. Tasks are not necessarily performed in the exact order described.

It is noted that some of the above described embodiments may include structure, acts or details of structures and acts that may not be essential to the invention and which are described as examples. Structure and acts described herein are replaceable by equivalents which perform the same function, even if the structure or acts are different, as known in the art. The embodiments described above are cited by way of example, and the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art. Therefore, the scope of the invention is limited only by the elements and limitations as used in the claims, wherein the terms "comprise," "include," "have" and their conjugates, shall mean, when used in the claims, "including but not necessarily limited to."

The invention claimed is:

1. A circuit verifier, comprising:
an input interface configured to receive descriptions of integrated circuits; and
a processing unit configured to scan through a description of an integrated circuit received through the input interface in order to identify black-boxes in the description, to assign the identified black-boxes to clock domains and to identify clock domain crossings, in which a black-box assigned to a first clock domain is connected to an element belonging to a second clock domain,
wherein the processing unit is configured to assign the identified black-boxes to clock domains by generating a tree of clock signals of the integrated circuit and assigning each black-box with the clock domains of all the clock signals entering or exiting the black-box.

2. The circuit verifier of claim 1, wherein the processing unit is configured to collect information on internal connections between ports of black-boxes and to identify clock domain crossings along a path passing through a black-box.

3. The circuit verifier of claim 1, wherein the processing unit is configured to collect information on internal connections between ports of black-boxes from parameters assigned to the instance of the black-box in the received circuit.

4. A circuit verifier, comprising:
an input interface configured to receive descriptions of integrated circuits; and
a processing unit configured to scan through a description of an integrated circuit received through the input interface in order to identify black-boxes in the description, to assign the identified black-boxes to clock domains and to identify clock domain crossings, in which a black-box assigned to a first clock domain is connected to an element belonging to a second clock domain, wherein the processing unit is configured to assign each of the ports of a black-box with a separate indication of the clock domains to which the port may belong.

5. The circuit verifier of claim 4, further comprising a display and wherein the processing unit is configured to present on the display a list of ports of a black-box and receive from a user indications of the clock domains to which the ports belong.

6. The circuit verifier of claim 4, wherein the processing unit is configured to assign ports with a plurality of clock domains, when a specific clock domain to which the port belongs is unknown.

7. The circuit verifier of claim 4, wherein the processing unit is configured to collect information on internal connections between ports of black-boxes from parameters assigned to the instance of the black-box in the received circuit.

8. A circuit verifier, comprising:
an input interface configured to receive descriptions of integrated circuits; and
a processing unit configured to scan through a description of an integrated circuit received through the input interface in order to identify black-boxes in the description, to assign the identified black-boxes to clock domains and to identify clock domain crossings, in which a black-box assigned to a first clock domain is connected to an element belonging to a second clock domain,
wherein the processing unit is configured to retrieve for identified black-boxes previously stored models which indicate the clock domains to which the ports of the black-box belong.

9. The circuit verifier of claim 8, wherein the processing unit is configured to assign the identified black-boxes to clock domains by generating a tree of clock signals of the integrated circuit and assigning each black-box with the clock domains of all the clock signals entering or exiting the black-box.

10. The circuit verifier of claim 8, wherein the processing unit is configured to retrieve the previously stored models from a remote server over the Internet.

11. The circuit verifier of claim 8, wherein the processing unit is configured to collect information on internal connections between ports of black-boxes from parameters assigned to the instance of the black-box in the received circuit.

12. A method of verifying a circuit, comprising:
receiving a description of an integrated circuit, by a processing unit;
scanning the description by the processing unit, to identify black-boxes in the description;
assigning the black-boxes to clock domains;
identifying clock domain crossings in which a black-box belonging to a first clock domain is connected to an element belonging to a second clock domain; and
presenting a list of identified clock domain crossings in the circuit to a user,
wherein assigning the black-boxes to clock domains comprises generating a tree of the clock signals of the received description and assigning each black-box to clock signals entering the black-box in the generated tree.

13. The method of claim 12, wherein assigning the black-boxes to clock domains comprises accessing a repository of black box models, retrieving from the repository models of black boxes in the integrated circuit and assigning the clock domains using information in the models.

14. The method of claim 12, further comprising collecting information on internal connections between ports of identified black-boxes from parameters assigned to the instance of the black-box in the received circuit.

15. A method of verifying a circuit, comprising:
receiving a description of an integrated circuit, by a processing unit;
scanning the description by the processing unit, to identify black-boxes in the description;
assigning the black-boxes to clock domains;
identifying clock domain crossings in which a black-box belonging to a first clock domain is connected to an element belonging to a second clock domain; and
presenting a list of identified clock domain crossings in the circuit to a user,
wherein assigning the black-boxes to clock domains comprises designating each port of the black-boxes with a separate clock domain indication.

16. The method of claim 15, wherein assigning the black-boxes to clock domains comprises generating a tree of the clock signals of the received description and assigning each black-box to clock signals entering the black-box in the tree.

17. The method of claim 15, wherein assigning the black-boxes to clock domains comprises receiving from a user through a user interface, indications of the clock domains to which ports of the black-boxes belong.

18. The method of claim 15, wherein assigning the black-boxes to clock domains comprises receiving from a user indications of relations between ports of a black-box.

19. The method of claim 15, further comprising collecting information on internal connections between ports of identified black-boxes from parameters assigned to the instance of the black-box in the received circuit.

* * * * *